(12) United States Patent
Ge et al.

(10) Patent No.: US 8,793,630 B2
(45) Date of Patent: Jul. 29, 2014

(54) CLOCK TREE PLANNING FOR AN ASIC

(75) Inventors: Liang Ge, Shanghai (CN); Suoming Pu, Shanghai (CN); Chen Xu, Beijing (CN); Bo Yu, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/478,272

(22) Filed: May 23, 2012

(65) Prior Publication Data

US 2012/0304136 A1 Nov. 29, 2012

(30) Foreign Application Priority Data

May 26, 2011 (CN) .......................... 2011 1 0138733

(51) Int. Cl.
*G06F 17/50* (2006.01)
(52) U.S. Cl.
USPC ........................................................ 716/108
(58) Field of Classification Search
USPC ................................................. 716/100, 108
See application file for complete search history.

(56) References Cited

U.S. PATENT DOCUMENTS

| | | | |
|---|---|---|---|
| 6,367,060 B1 | 4/2002 | Cheng et al. | |
| 6,480,991 B1 * | 11/2002 | Cho et al. ........................ | 716/122 |
| 6,536,018 B1 * | 3/2003 | Chisholm et al. ............... | 716/136 |
| 7,409,657 B2 | 8/2008 | Miya | |
| 7,467,367 B1 | 12/2008 | Li et al. | |
| 7,546,567 B2 | 6/2009 | Cheon et al. | |
| 7,844,931 B2 | 11/2010 | Hutzl et al. | |
| 7,930,580 B2 * | 4/2011 | Marchesini et al. ............ | 713/500 |
| 8,020,122 B2 * | 9/2011 | Cheng et al. .................... | 716/105 |
| 2003/0005398 A1 * | 1/2003 | Cho et al. ........................ | 716/8 |
| 2003/0041128 A1 * | 2/2003 | Vandecappelle et al. ....... | 709/220 |
| 2004/0044979 A1 * | 3/2004 | Aji et al. .......................... | 716/13 |
| 2005/0278676 A1 * | 12/2005 | Dhanwada et al. .............. | 716/9 |
| 2008/0209389 A1 * | 8/2008 | Baumgartner et al. ......... | 717/104 |
| 2008/0229266 A1 | 9/2008 | Bueti et al. | |
| 2009/0015301 A1 * | 1/2009 | Marchesini et al. ............ | 327/141 |
| 2009/0132975 A1 * | 5/2009 | Cheng et al. ..................... | 716/5 |
| 2009/0217225 A1 | 8/2009 | Sunder et al. | |
| 2010/0070941 A1 | 3/2010 | Sircar et al. | |
| 2010/0235802 A1 | 9/2010 | Singasani | |
| 2012/0047478 A1 * | 2/2012 | Ge et al. .......................... | 716/108 |

OTHER PUBLICATIONS

Shen, et al. "Gate Planning During Placement for Gated Clock Network", 2008 IEEE.

* cited by examiner

*Primary Examiner* — Suchin Parihar
(74) *Attorney, Agent, or Firm* — Schmeiser, Olsen & Watts; Richard M. Kotulak

(57) ABSTRACT

The present invention discloses a method and system for clock tree planning for an ASIC, the method comprising: determining a netlist and a timing constraint file of the ASIC; creating a sequential device undirected graph for sequential devices in the netlist according to connection relationships of the sequential devices in the netlist and timing constraint relationships of the sequential devices in the timing constraint file; grouping the sequential devices in the netlist according to the sequential device undirected graph, such that the sequential devices in one group do not have a timing constraint relationship with the sequential devices in another group. The ASIC design method improved by using this method will reduce the design cycle from weeks to days, and enable designer to quickly plan the clock tree, thus reducing the design time and improving the design efficiency.

20 Claims, 6 Drawing Sheets

---

Creating a connection undirected graph for the sequential devices in the netlist according to the connection relationships of the sequential devices in the netlist(S301)

↓

Creating a timing undirected graph for the sequential devices in the netlist according to the timing constraint relationships of the sequential devices in the timing constraint file(S302)

↓

Combining the connection undirected graph and the timing undirected graph to obtain a sequential device undirected graph (S303)

Connection undirected graph

Timing undirected graph

Sequential device undirected graph

Connection undirected graph

Timing undirected graph

Sequential device undirected graph

CLOCK TREE PLANNING FOR AN ASIC

FIELD OF THE INVENTION

The present invention generally relates to integrated circuit design, more particularly, to a method and system for clock tree planning for an application specific integrated circuit.

DESCRIPTION OF THE RELATED ART

In the technical field of integrated circuits, an application specific integrated circuit (ASIC) refers to an integrated circuit which is designed and manufactured according to specific user demands and specific electronic system requirements. An ASIC is characterized in oriented to specific user demands, and during mass production, compared with general integrated circuits, it has the advantages of smaller size, lower power consumption, improved reliability, improved performance, enhanced security and reduced costs.

FIG. 1 shows the flow of a current ASIC design. At step S101, a gate level netlist is generated; at step S102, full placement is performed. At step S103, static timing analysis is performed, and the step uses an ideal clock model for anticipation of the clock effect. At step S104, a clock tree is inserted, which is also called clock tree planning. The current clock tree planning process may be performed manually, or by an electronic design automation (EDA) tool, and the most popular clock trees are accomplished by using automation tools. Its basic principle is, according to the distances from the sequential devices to the clock source, placing buffers at proper locations so as to minimize the clock skew from the clock source to each sequential device. The inserted tree-shaped signal relay network formed by buffers is called a clock tree. The inserted clock tree is required to satisfy the timing constraints in a timing constraint file, so as to maintain timing convergence to achieve the design effect. Then at step S105, timing analysis with the clock and clock tree adjustment are performed; at step S106, wiring and timing convergence analysis after the wiring, i.e., clock balancing, is performed; finally at step S107, a layout is generated. In this way, a preliminary design flow is accomplished.

However, the above design flow of FIG. 1 faces some problems in the design of modern ultra-large ASICs, mainly as follows:

With the scale of ASICs becoming larger and larger, the work of clock tree planning per se is more and more time consuming. For an ultra-large ASIC at ten million gate level, the design principle used by current design tools is to make the clock skews and clock latencies of all the terminals (that is, sequential devices, e.g., registers, SRAMs, etc) of the clock tree as small as possible; for instance, design tools such as Clock Design, Encounter, ICC all perform clock balancing for each sequential device according to such a design principle, so that the time consumption of clock tree planning, clock tree insertion and clock tree adjustment usually is in days or even weeks, causing a long design cycle and that the products cannot enter the market rapidly.

Design tools such as Clock Designer, Encounter, ICC have another clock tree planning manner which is in combination with the above implementation, in which the circuit designers, by communicating with the logic designers, group all the sequential devices, and then perform clock balancing within each group of sequential devices, and finally consider the clock balance among each groups. Since the number of sequential devices is very large, such communication needs to be iterated repeatedly, and the design cycle is still very long.

Both of the above prior solutions will cause the design cycle of the products to be over-long, possibly missing advantageous market timing.

SUMMARY OF THE INVENTION

Therefore, a method is needed to which make the designers to quickly plan the clock tree so as to reduce the design time. The present invention proposes a method and system for clock tree planning for an ASIC, wherein the sequential devices are grouped; after the grouping, devices that do not have timing constraints are divided into different groups, reducing the number of sequential devices connected by the same clock tree root node, reducing to the greatest extent the redundant balance within the clock tree, and reducing the complexity of clock tree balancing, so that within a group, the clock tree is inserted using the design principle used in the prior design tools to make the clock skews and clock latencies of all the terminals of the clock tree (i.e., the sequential devices) be as small as possible, to achieve clock balance. The ASIC design method and system improved by this method can reduce the design flow from weeks to days, and enable the designers to quickly plan the clock tree, thus reducing the design time and improve the design efficiency.

According to an aspect of the present invention, a method for clock tree planning for an ASIC is provided, comprising: determining a netlist and a timing constraint file of the ASIC; creating a sequential device undirected graph for the sequential devices in the netlist according to the connection relationships of the sequential devices in the netlist and the timing constraint relationships of the sequential devices in the timing constraint file;
grouping the sequential devices in the netlist according to the sequential device undirected graph, such that the sequential devices in one group do not have a timing constraint relationship with the sequential devices in another group According to another aspect of the present invention, a system for clock tree planning for an ASIC is provided, comprising:
determining means configured to determine a netlist and a timing constraint file for the ASIC;
sequential device undirected graph creating means configured to create a sequential device undirected graph for the sequential devices in the netlist according to the connection relationship of the sequential devices in the netlist and the timing constraint relationship of the sequential devices in the timing constraint file;
grouping means configured to group the sequential devices in the netlist according to the sequential device undirected graph, such that the sequential devices in one group do not have a timing constraint relationship with the sequential devices in another group

BRIEF DESCRIPTION OF THE ACCOMPANYING DRAWINGS

The above and other objectives, features and advantages of the present invention will become more apparent by referring to more detailed description of the exemplary embodiments of the present invention in the accompanying drawings, in which the same reference numerals usually denote the same components in the exemplary embodiments of the present invention.

FIG. 1 shows the flow of a current ASIC design;

FIG. 2 schematically shows method steps for clock tree planning for an ASIC according to an embodiment of the present invention;

BEST MODES FOR CARRYING OUT THE INVENTION

Preferred embodiments of the present invention will be described in great detail by referring to the accompanying drawings, in which preferred embodiments of the present invention are displayed. However, the present invention may be realized in various forms and should not be construed as being limited by the embodiments set forth here. In contrast, the embodiments are provided so that the present invention may be more thorough and complete, and the scope of the present invention may be completely conveyed to those skilled in the art.

First, some basic concepts are clarified to facilitate subsequent description of the inventions.

Netlist: a file or data structure to express the topological connection relationships of the devices of a digital circuit.

Clock tree: the inserted tree-shaped signal relay network formed by buffers is called a clock tree. Therefore, an ASIC usually has one or more clock trees.

Clock tree latency: it means that for a single clock tree, the transfer time of the clock signal from the root node to a leaf node is the latency of the clock tree.

Clock tree skew: it means that for the respective sequential devices on a single clock tree, the latencies of the clock tree are different.

Clock tree effect: in the present invention it means the timing effect of the clock tree, which mainly includes clock tree latency and clock tree skew.

Figure 1:
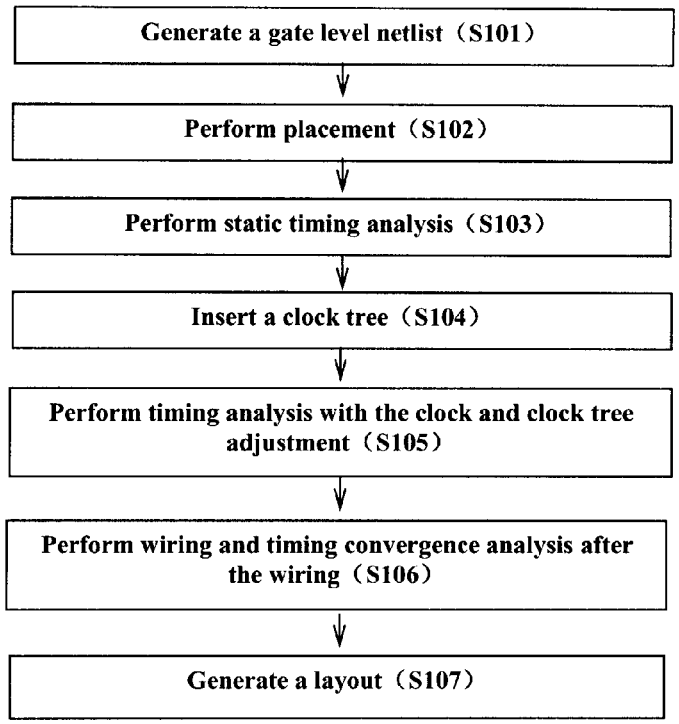

In the current ASIC design field, front end designers and back end designers are two different groups of designers; the front end designers understand the functions and requirements of the circuit, while the back end designers always focus on the layout design according to the logic designers' output, and they do not specifically understand the functions of the circuit. In the industry, standard deliverables that the front end designers give to the back end designers include a netlist and a timing constraint file. Then the back end designers accomplish the design process from step S102 to step S107 in FIG. 1. To satisfy timing requirements which were asserted in timing constraint file, the clock signal arrival time need to be balanced. For example, if some sequential device has a larger latency while some other have a smaller latency, a buffer is inserted into the timing path of the sequential device with the smaller latency to increase the latency, such that finally the clock signal arrive at the clock pins of the respective sequential devices almost at the same time, and the skew of the clock tree is the minimum and clock tree balance is achieved. In addition, if there are no timing constraints among some sequential devices, there is no need to balance.

For a complex design with many sequential devices, the clock tree planning method provided in the present invention (i.e., step S104 in FIG. 1) can further be divided into two steps: first the sequential devices are separated into groups according to connections, so that there are no timing constraints between groups of sequential devices, and only the sequential devices within a group have timing constraints; then for each group of sequential devices, the current balanced clock tree insertion method is used to build a balance clock tree to satisfy timing requirements.

Figure 2:
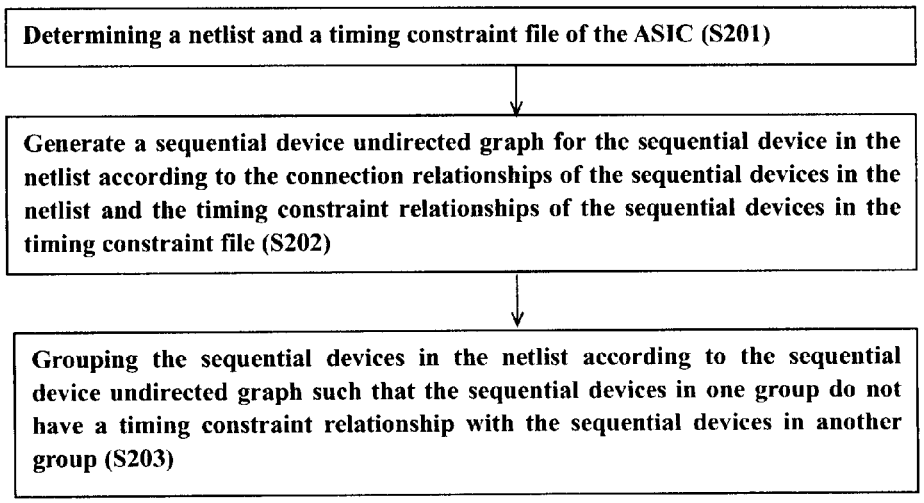
Figure 4:
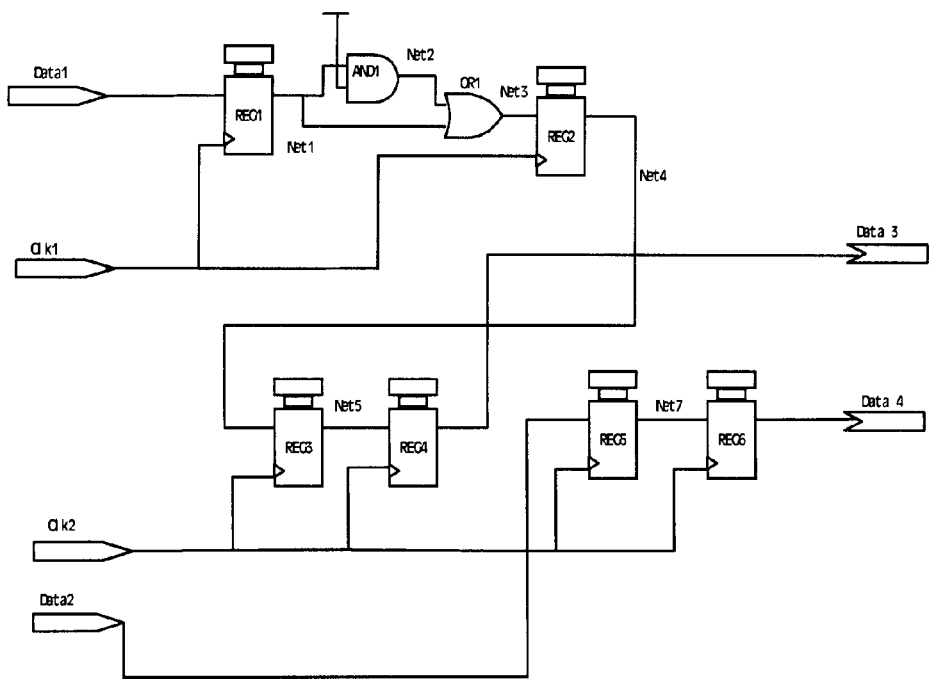
FIG. 4 shows an exemplary ASIC.

In an embodiment of the present invention, a method for clock tree planning for an ASIC is provided, such that groups of sequential devices do not have timing constraints there between while only the sequential devices within a group have timing constraints there between; moreover, there is no need for the circuit designers to iteratively communicate with the logic designers, and they only need to obtain standard deliverables to execute. FIG. 2 schematically shows the steps of the method, which steps will be described by referring to an embodiment. According to FIG. 2, at step S201, the netlist and timing constraint file of the ASIC is determined FIG. 4 shows an exemplary ASIC; in FIG. 4, the Clk signal on the left side denotes the source end of the clock signal, Data 1 and Data 2 denote data output, Data 3 and Data 4 denote data input, each REG denotes a sequential device, AND denotes an AND gate, and OR denotes an OR gate. The netlist of the ASIC in FIG. 4 is as follows: the netlist includes at least the source device Clk and the sequential devices REGs forming the clock tree and the connection relationships thereof. Here, the source end of the clock tree is the clock input end of the source device forming the clock tree, and the terminal end of the clock tree is the clock output end of the source devices forming the clock tree.

The contents of the netlist of the ASIC as shown in FIG. 4 are as follows:

```
input  Data1, Data2, Clk1, Clk2;
output Data3, Data4;
wire Net1,Net2, Net3, Net4, Net5, Net6, Net7;
...
REG  REG1( //define connection relationships of the first sequential
device;
             .D (Data1),  //pin D of the first sequential device is
connected with Data1;
             .E (Clk1),   //pin E of the first sequential device is
             connected with Clk1
          .L2(Net1)   //pin L2 of the first sequential device is connected
          with Net1;
);
REG  REG2(  //define connection relationships of the second sequential
device;
             .D (Net3),
             .E (Clk1),
             .L2(Net4)
          );
REG  REG3(  //define connection relationships of the third sequential
device;
             .D (Net4),
             .E (Clk2),
             .L2(Net5)
          );
REG  REG4(
             .D (Net5),
             .E (Clk2),
             .L2(Data3)
          );
REG  REG5(
             .D (Data2),
             .E (Clk2),
             .L2(Net7)
          );
REG  REG6(
             .D (Net7),
             .E (Clk2),
```

```
            .L2(Data4)
        );
AND   AND1(    //define connection relationships of the first AND gate;
            .A(NET1),
            .B(VDD),
            .Y(NET2)
);
OR         OR1(    //define connection relationships of the first OR gate;
            .A(NET2),
            .B(NET1),
            .Y(NET3)
);
```

The contents of the timing constraint file of the ASIC as shown in FIG. 4 are as follows:

```
Timing Constraint:

create_clock CLK1 [get_ports Clk1] -period 10 -waveform {0 5} #
generate a clock, cycle being 10, rising edge being 0 and falling edge
being 5
create_clock CLK2 [get_ports Clk2] -period 14 -waveform {0 7}
set_clock_uncertainty 0.1 [get_clocks CLK1]      #setting clock edge
dithering
set_clock_uncertainty 0.1 [get_clocks CLK2]
set_input_delay -clock CLK1 4 [get_ports {Data1}]      #set
input latency of the signal
set_input_delay -clock CLK2 3 [get_ports {Data2}]
set_output_delay 1 [get_ports { Data3}]                 #set output
latency of the signal
set_output_delay 1 [get_ports { Data4}]
set_clock_group -asynchronous -name g1 -group CLK1 -group CLK2
#set    an asynchronous clock between CLK1 and CLK2
set_false_path -from REG5/L2 -to REG6/D     #set the two point
path as a false constraint path
set_multicycle_path 2 -from REG1/L2 -to REG2/D     #set the path
as  a multicycle latency path
```

Figure 3:
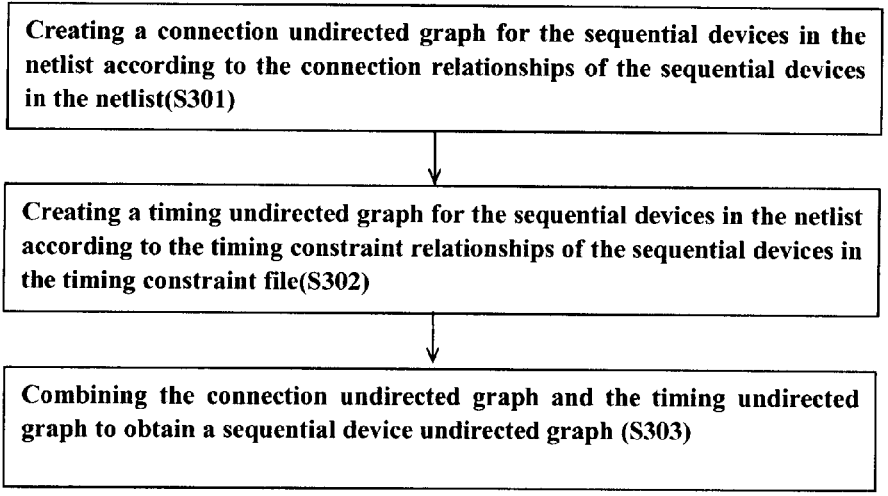
FIG. 3 shows a specific flow of step S202 in FIG. 2.

Returning to FIG. 2, at step S202, a sequential device undirected graph is created for the sequential devices in the netlist according to the connection relationships of the sequential devices in the netlist and the timing constraint relationships of the sequential devices in the timing constrain file. FIG. 3 shows a specific flow of step S202 in FIG. 2. According to FIG. 3, at step S301, a connection undirected graph is created for the sequential devices in the netlist according to the connection relationships of the sequential device in the netlist; at step S302, a timing undirected graph is created for the sequential devices in the netlist according to the timing constraint relationships of the sequential devices in the timing constraint file; at step S303, the connection undirected graph and the timing undirected graph is combined to obtain the sequential device undirected graph.

During creating the connection undirected graph, first the sequential devices in the netlist need to be obtained. Each device (including IP) in a digital circuit has a label denoting whether or not it is a sequential device, as one of the features of the device, and listed in a library file of the design. Therefore, after the netlist related to the clock tree is obtained, according to the type of a device, the library file is checked piece by piece to determine whether the device is a sequential device. Thus, all the sequential devices connected by the clock tree can be extracted. In another implementation, a data structure (e.g., a table, an array, etc.) may be used to list the names of all the sequential devices involved in the netlist, and then the names of the all the devices in the netlist are examined one by one by a program to see whether they are in the scope of names listed in the data structure, so as to obtain all the sequential devices. Then in the connection undirected graph, nodes are used to represent the sequential devices in the netlist; and finally, connection edges are created between the nodes of the connection undirected graph, wherein a connection edge between a node and another node in the connection undirected graph indicates that the sequential devices represented by the two nodes are connected by a path in the netlist. Here, whether sequential devices in the netlist are connected by a path is determined according to the connection relationship of the sequential devices in the netlist. Paths include connection paths or combination paths. Here, a connection path refers to that two sequential devices are directly connected; combination paths include device paths and branch paths, wherein a device path refers to that two sequential devices are connected by at least one non-sequential device there between, and a branch path refers to that there is a circuit branch at the connected part of the two sequential devices. That is to say, as long as there is a connected path between two sequential devices, a connection edge is created between the nodes to which the two sequential devices correspond, no matter how many device and branch paths are included in the path. Since the netlist includes the connection relationships of all the devices, according to these connection relationships, it can be determined whether any two sequential devices are connected by a path.

The creation of a timing undirected graph is complex. In a timing undirected graph, the sequential devices in the netlist are still denoted as nodes. In a timing constraint file, as lone one of the following three conditions is satisfied, a timing edge is created between two sequential devices.

Figure 5:
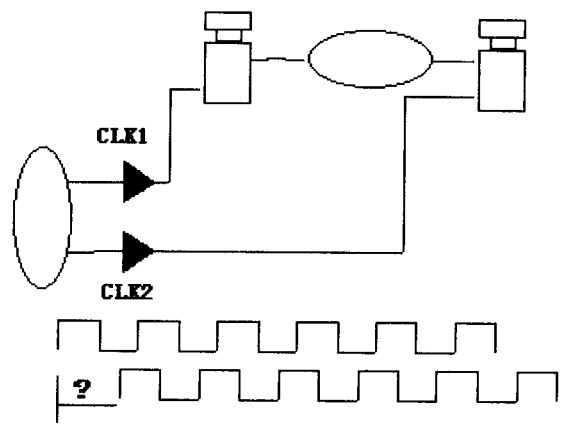
FIG. 5 shows the definition of an asynchronous clock.

(1) Asynchronous clocks: FIG. 5 shows the definition of an asynchronous clock; the two sequential devices have their own driving clocks, and the relationship between the rising or falling edges of the two clocks cannot be predicted, thus in the timing undirected graph a timing edge is created between the two sequential devices.

Figure 6:
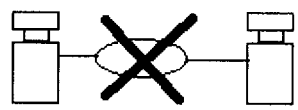
FIG. 6 shows the definition of a false path.

(2) False path: FIG. 6 shows the principle of a false path. The two sequential devices have a path, but they do not need timing constraints therebetween. This is called a false path. In the timing undirected graph, a timing edge is created between the sequential devices having a false path.

Figure 7:
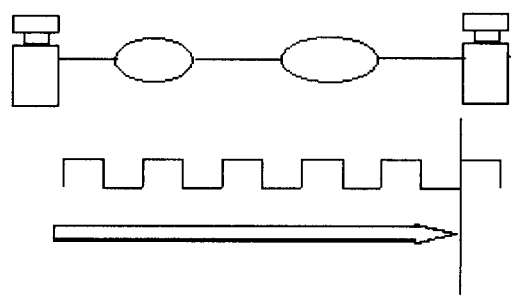
FIG. 7 shows the definition of a multicycle path.

(3) Multicycle path with enough margin: usually the number of timing check cycles between two sequential devices is one clock cycle; when the number of timing check cycles between two sequential devices exceeds the constraint of one clock cycle, it is called a multicycle path. FIG. 7 shows the definition of a multicycle path. In the timing undirected graph, a timing edge can be created between the sequential devices having a multicycle path.

It should be appreciated that in the above three cases, there is no need to balance the clock.

Therefore, when timing edges are created between the nodes of the timing undirected graph, if a timing edge is created between one node and another node in the timing undirected graph, this means that the sequential devices represented by the two nodes have at least one of the above three timing constraints therebetween. The sequential devices with a timing edge created do not need clock balancing. Here, the asynchronous clock, the false path and the multicycle path are the timing constraint relationships included in a timing constraint file. In other words, a timing constraint file may include many timing constraint relationships, and the asynchronous clock, the false path and the multicycle path are one type of constraint relationships therein. This does not mean that all timing constraint files have such timing constraint relationships, rather, a timing constraint file may not include any one of the above three timing constraint relationships, in which case, in the timing undirected graph there are only nodes, and there is no timing edge.

In a further implementation, a parameter can be set for the multicycle path, and the parameter denotes that a timing edge will be created between two sequential devices only when the number of the timing check cycles between the two sequential devices exceeds the set number of clock cycles. At this time, the creation of the timing undirected graph includes: first, the sequential devices in the netlist are represented by nodes in the timing undirected graph; then timing edges are created between the nodes of the timing undirected graph, wherein a timing edge between one node and another node in the timing undirected graph denotes that the sequential devices represented by the two nodes have at least one of the following constraints therebetween: an asynchronous clock; a false path; a multicycle path, and the number of the timing check cycles between two sequential devices exceeds a preset number of clock cycles; wherein the asynchronous clock, the false path and the multicycle path are the timing constraint relationships included in the timing constraint file. If the sequential devices represented by the two nodes do not have the above timing constraint relationships therebetween, no timing edge is created between the two nodes.

Figure 8:
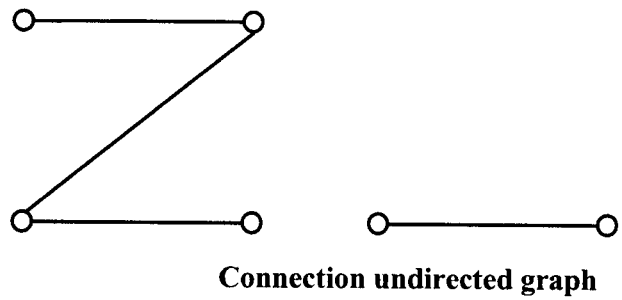
FIG. 8 shows a connection undirected graph, a timing undirected graph and a sequential device undirected graph created for an ASIC as shown in FIG. 4.
Figure 8:
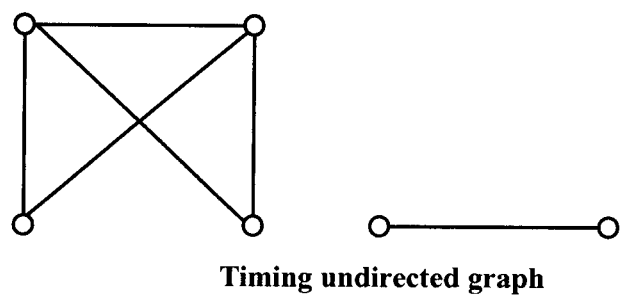
Figure 8:
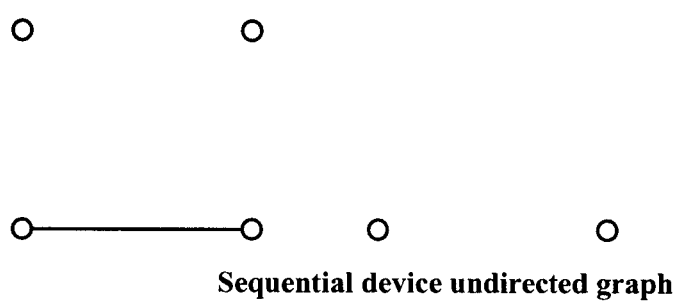
Figure 9:
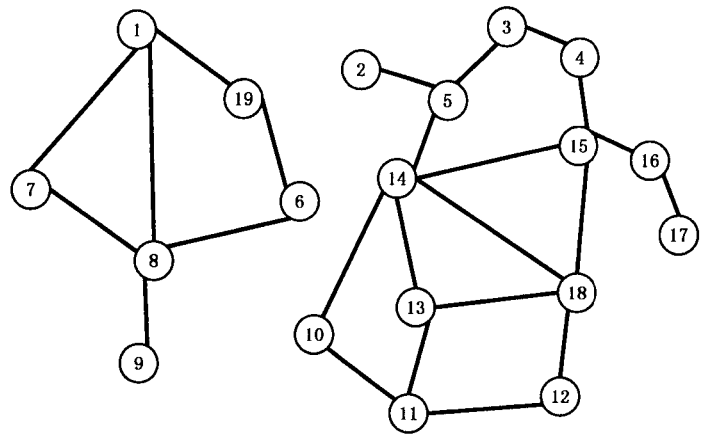
FIG. 9 shows a connection undirected graph, a timing undirected graph and a sequential device undirected graph created for another ASIC with a netlist and timing constraint file not shown.
Figure 9:
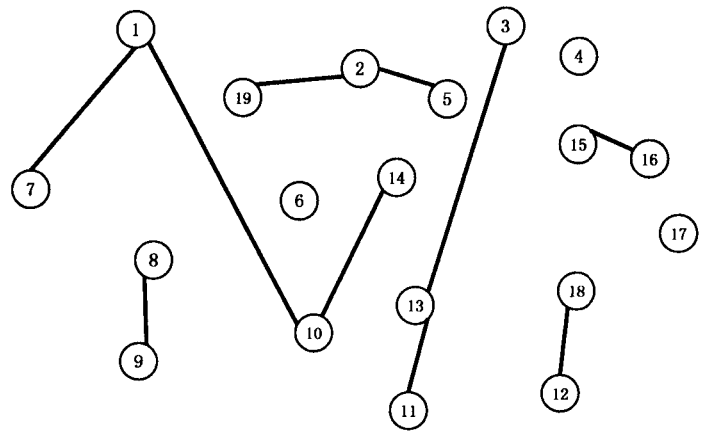
Figure 9:
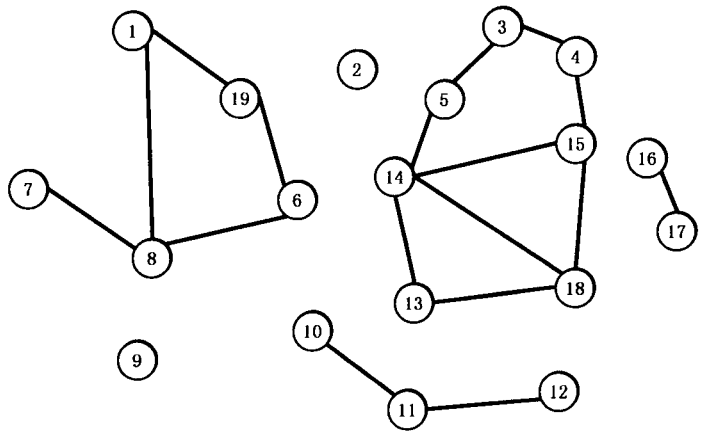

During the process of combining the connection undirected graph and the timing undirected graph, first the nodes in one of the connection undirected graph and the timing undirected graph are expressed as the nodes in the sequential device undirected graph; as can be seen from the creation process of the above two undirected graphes, the nodes included in the two undirected graphes are the same. Then edges are created between the nodes of the sequential device undirected graph, wherein an edge between one node and another node in the sequential device undirected graph denotes that there is a connection edge between the nodes to which the two nodes correspond in the connection undirected graph, but there is no timing edge between the nodes to which the two nodes correspond in the timing undirected graph. Thus the combination of the undirected graphs is accomplished. That is to say, in the combined sequential device undirected graph, for the nodes having two edges, i.e., there are both a connection edge and a timing edge, the edges between the two nodes are deleted; but when there is only a connection edge and no timing edge, the edge between the two nodes is maintained. Since the sequential devices with a timing edge created do not need clock balancing, in the sequential device undirected graph, there is no edge between the sequential devices with a timing edge created. The connection undirected graph, the timing undirected graph and the sequential device undirected graph created for the integrated circuit as shown in FIG. 4 according to steps S301, S302 and S303 of the above method are as shown in FIG. 8. The connection undirected graph, timing undirected graph, and sequential device undirected graph created for another ASIC with a netlist and timing constraint file which are not shown are as shown in FIG. 9.

Returning to FIG. 2, at step S203, the sequential devices in the netlist are grouped according to the sequential device undirected graph, such that the sequential devices in one group and the sequential devices in another group do not have a timing constraint relationship. Specifically, the sequential devices represented by the nodes included in a connected sub-graph in the sequential device undirected graph are grouped in the same group. A single node can be taken as a connected sub-graph, and thus its corresponding sequential device is also grouped into one group. For example, the sequential device undirected graph of FIG. 8 includes 5 connected sub-graphs, and the sequential devices may be divided into 5 groups. In subsequent timing analysis, clock balancing only needs to be performed on the group including two sequential devices, and the clock balancing is reduced from the original 6 sequential devices to 2 sequential devices. The sequential device undirected graph of FIG. 9 includes 6 connected sub-graphs, and the sequential devices may be divided into 6 groups; subsequent timing analysis only needs to perform clock balancing on the groups including two or more sequential devices, and the clock balancing is reduced from the original 19 sequential devices to 4 groups, each group having 7, 5, 3, 2 sequential devices respectively. The subsequent clock balancing work is greatly reduced.

Using the above method to group will make the sequential devices of the respective groups do not have timing relationships there between, and thus there is no need for clock balancing; moreover, the number of sequential devices within each group is greatly reduced, and clock tree is inserted by using the design principle to make the clock skew and clock latency of all the terminals (i.e., sequential devices) of the clock tree be as small as possible as adopted in the current design tools, to achieve clock balance. The ASIC design method improved by the method will reduce the design cycle from weeks to days, and make the designers quickly plan the clock tree, thus reducing the design time and improving the design efficiency.

Figure 10:
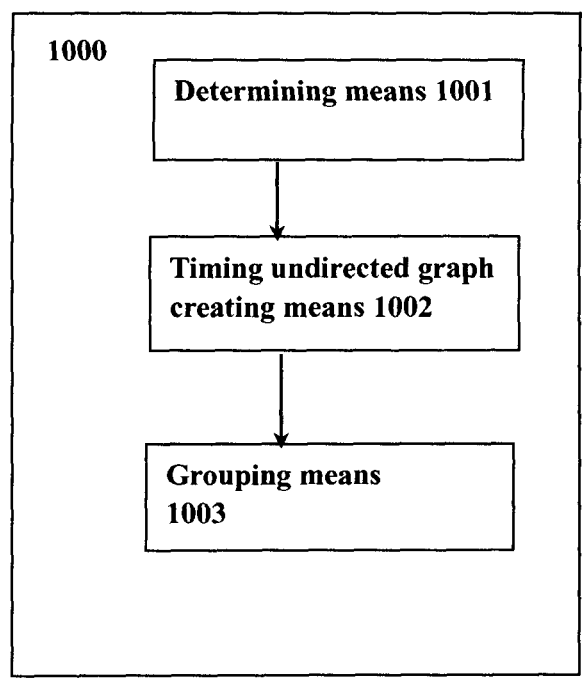
FIG. 10 shows the structure of a system for clock tree planning for an ASIC.

Under the same inventive concept, the present invention further discloses a system 1000 for clock tree planning for an ASIC, comprising: determining means 1001 configured to determine a netlist and a timing constraint file of the ASIC; sequential device undirected graph creating means 1002 configured to create a sequential device undirected graph for sequential devices in the netlist according to the connection relationships of the sequential devices in the netlist and the timing constraint relationships of the sequential devices in the timing constraint file; grouping means 1003 configured to group the sequential devices in the netlist according to the sequential device undirected graph, such that the sequential devices in one group do not have a timing constraint relationship with the sequential devices in another group In an implementation, the sequential device undirected graph creating means comprises (not shown in FIG. 10): a connection undirected graph creating means configured to create a connection undirected graph for the sequential devices in the netlist according to the connection relationships of the sequential devices in the netlist; a timing undirected graph creating means configured to create a timing undirected graph for the sequential devices in the netlist according to the timing constraint relationships of the sequential devices in the timing constraint file; and a combining means configured to combine the connection undirected graph and the timing undirected graph to obtain the sequential device undirected graph.

In another implementation, the connection undirected graph creating means comprises (not shown in FIG. 10): a connection undirected graph node creating means configured to represent, in the connection undirected graph, the sequential devices in the netlist by nodes; a connection undirected graph connection edge creating means configured to create connection edges between nodes of the connection undirected graph, wherein an connection edge between one node and another node in the connection undirected graph denotes that the sequential devices represented by the two nodes are connected via a path in the netlist; wherein whether the sequential devices are connected via a path in the netlist is determined according to the connection relationship of the sequential devices in the netlist.

In still another implementation, the timing undirected graph creating means comprises (not shown in FIG. 10): a timing undirected graph node creating means configured to represent, in the timing undirected graph, the sequential devices in the netlist by nodes; a timing undirected graph timing edge creating means configured to create timing edges between nodes of the timing undirected graph, wherein a timing edge between one node and another node in the timing undirected graph denotes that the sequential devices represented by the two nodes have at least one of the following timing constraints there between: an asynchronous clock; a false path; a multi-cycle path, wherein the asynchronous clock, the false path, the multi-cycle path are the timing constraint relationships included in the timing constraint file.

In still another implementation, the timing undirected graph creating means comprises (not shown in FIG. 10): a timing undirected graph node creating means configured to create timing edges between nodes of the timing undirected graph, wherein a timing edge between one node and another node in the timing undirected graph denotes that the sequential devices represented by the two nodes have at least one of the following timing constraints there between: an asynchronous clock; a false path; a multi-cycle path, and the path between the two sequential devices exceeds a preset number of clock cycles; wherein the asynchronous clock, the false path and the multicycle path are the timing constraint relationships included in the timing constraint file.

In yet another implementation, the combination means comprises (not shown in FIG. 10): a sequential device undirected graph node creating means configured to represent the nodes in one of the connection undirected graph and the timing undirected graph as the nodes in the sequential device undirected graph; a sequential device undirected graph edge creating means configured to create edges between nodes of the sequential device undirected graph, wherein an edge between one node and another node in the sequential device undirected graph denotes that there is a connection edge between the nodes to which the two nodes correspond in the connection undirected graph, but there is no timing edge between the nodes to which the two nodes correspond in the timing undirected graph.

In still another implementation, the grouping means is further configured to group the sequential devices represented by the nodes included in a connected sub-graph in the sequential device undirected graph into the same group.

The present invention may take the form of a hardware embodiment, a software embodiment or an embodiment including both hardware components and software components. In the preferred embodiments, the present invention may be realized as software, including but not limited to firmware, resident software, micro-code, etc.

Moreover, the present invention may take the form of a computer program product that can be accessed from a computer usable or computer readable medium which provides program code to be used by or in conjunction with the computer or any instruction executing system. For the purpose of description, the computer usable or readable mechanism can be any tangible device, which may include, store, communicate, propagate or transmit a program to be used by or in conjunction with the instruction executing system, device or apparatus.

The medium may be an electronic, magnetic, optical, electromagnetic, infrared, or semiconductor system (or apparatus or device). Examples of the computer readable medium includes a semi-conductor or solid-state storage, magnetic tape, a removable computer diskette, a random access memory (RAM), a read-only memory (ROM), a hard disc and an optical disc. Currently, examples of optical disk include compact disc-read only memory (CD-ROM), compact disc-read/write (CD-R/W) and DVD.

The data processing system suitable for storing/executing the program code will include at least one processor, which is coupled, directly or directly through a system bus, to a memory element. The memory element may include a local memory which are utilized during the actual execution of the program code, a mass storage, and a cache providing temporal storage for at least some program code so as to reduce the number of times for retrieving the code from the mass storage during the execution.

An input/output or I/O device (including but not limited to keyboard, display and pointing devices, etc.) may be coupled to the system either directly or through an intermediate I/O controller.

A network adapter may also be coupled to the system so that the data processing system may be coupled to other data processing system or a remote printer or a storage device through an intermediate private or public network. A modem, a cable modem and an Ethernet card are only some examples of currently available types of network adapters.

As can be appreciated from the above description, modifications and changes to the implementations of the present invention can be made without departing from the true spirit of the present invention. The description in the present specification is only illustrative, and should not be construed as limitative. The scope of the present invention is only limited by the appended claims.

The invention claimed is:

1. A method for clock tree planning for an application specific integrated circuit (ASIC), the method comprising:
   determining a netlist and a timing constraint file of the ASIC;
   using a processor, creating a sequential device undirected graph for the sequential devices in the netlist according to connection relationships of the sequential devices in the netlist and timing constraint relationships of the sequential devices in the timing constraint file;
   using a processor, grouping the sequential devices in the netlist according to the sequential device undirected graph, such that the sequential devices in one group do not have a timing constraint relationship with the sequential devices in another group; and
   wherein the creating a sequential device undirected graph for sequential devices in the netlist according to connection relationships of the sequential devices in the netlist and timing constraint relationships of the sequential devices in the timing constraint file comprises:
      creating a connection undirected graph for the sequential devices in the netlist according to the connection relationships of the sequential devices in the netlist;
      creating a timing undirected graph for the sequential devices in the netlist according to the timing constraint relationships of the sequential devices in the timing constraint file; and
      combining the connection undirected graph and the timing undirected graph to obtain the sequential device undirected graph.

2. The method of claim 1, wherein the creating a connection undirected graph for the sequential devices in the netlist according to the connection relationships of the sequential devices in the netlist comprises:
   representing, in the connection undirected graph, the sequential devices in the netlist by nodes;
   creating connection edges between nodes in the connection undirected graph, wherein the connection edge connecting one node with another node in the undirected graph denotes that the sequential devices represented by the two nodes are connected by a path in the netlist; and wherein whether sequential devices in the netlist are connected by the path is determined by the connection relationship of the sequential devices in the netlist.

3. The method of claim 2, wherein the creating a timing undirected graph for the sequential devices in the netlist according to the timing constraint relationships in the timing constraint file comprises:

representing, in the timing undirected graph, sequential devices in the netlist by nodes;

creating timing edges between the nodes in the timing undirected graph, wherein the timing edge between one node and another node in the timing undirected graph denotes that at least one of the following timing constraints exist between the sequential devices represented by the two nodes:

an asynchronous clock;

a false path; and a multi-cycle path; and wherein the asynchronous clock, the false path and the multicycle path are timing constraint relationships included in the timing constraint file.

4. The method of claim 1, wherein the creating a timing undirected graph for the sequential devices in the netlist according to the timing constraint relationships in the timing constraint file comprises:

representing, in the timing undirected graph, the sequential device in the netlist by nodes;

creating timing edges between nodes in the timing undirected graph, wherein the timing edge between one node and another node in the timing undirected graph denotes that at least one of the following timing constraints exist between the sequential devices represented by the two nodes:

an asynchronous clock;

a false path; and a multi-cycle path and the number of timing check cycles between the two sequential devices exceeds a preset number of clock cycles; and wherein the asynchronous clock, the false path and the multi-cycle path are timing constraint relationships included in the timing constraint file.

5. The method of claim 1, wherein the combining the connection undirected graph and the timing undirected graph to obtain the sequential device undirected graph comprises:

denoting nodes in one of the connection undirected graph and the timing undirected graph as the nodes in the sequential device undirected graph; and creating edges between nodes in the sequential device undirected graph, wherein the edge between one node and another node in the sequential device undirected graph denotes that there is a connection edge between the nodes to which the two nodes correspond in the connection undirected graph, wherein there is no timing edge between the nodes to which the two nodes correspond in the timing undirected graph.

6. The method of claim 5, wherein the grouping the sequential devices in the netlist according to the sequential device undirected graph comprises:

grouping the sequential devices represented by the nodes included in a connected sub-graph in the sequential device undirected graph into one group.

7. The method of claim 1, wherein said timing constraint file defines clock signal arrival times at said sequential devices.

8. A system for clock tree planning for an ASIC, comprising:

determining means configured to determine a netlist and a timing constraint file of the ASIC;

sequential device undirected graph creating means configured to create a sequential device undirected graph for the sequential devices in the netlist according to connection relationships of the sequential devices in the netlist and timing constraint relationships of the sequential devices in the timing constraint file;

grouping means configured to group the sequential devices in the netlist according to the sequential device undirected graph, such that the sequential devices in one group do not have a timing constraint relationship with the sequential devices in another group; and wherein the sequential device undirected graph creating means comprises:

connection undirected graph creating means configured to create a connection undirected graph for the sequential devices in the netlist according to the connection relationships of the sequential devices in the netlist;

timing undirected graph creating means configured to create a timing undirected graph for the sequential devices in the netlist according to the timing constraint relationships of the sequential devices in the timing constraint file; and combination means configured to combine the connection undirected graph and the timing undirected graph to obtain the sequential device undirected graph.

9. The system of claim 8, wherein the connection undirected graph creating means comprises:

connection undirected graph node creating means configured to represent, in the connection undirected graph, the sequential devices in the netlist by nodes;

connection undirected graph connection edge creating means configured to create connection edges between nodes in the connection undirected graph, wherein the connection edge connecting one node with another node in the connection undirected graph denotes that the sequential devices represented by the two nodes are connected by a path in the netlist; and wherein whether sequential devices in the netlist are connected by a path IS determined by the connection relationship of the sequential devices in the netlist.

10. The system of claim 9, wherein the timing undirected graph creating means comprises:

timing undirected graph node creating means configured to represent, in the timing undirected graph, sequential devices in the netlist by nodes;

timing undirected graph timing edge creating means configured to create timing edges between nodes in the timing undirected graph, wherein the timing edge between one node and another node in the timing undirected graph denotes that at least one of the following timing constraints exist between the sequential devices represented by the two nodes:

an asynchronous clock;

a false path; and a multi-cycle path; and wherein the asynchronous clock, the false path and the multicycle path are timing constraint relationships included in the timing constraint file.

11. The system of claim 9, wherein the timing undirected graph creating means comprises:

timing undirected graph node creating means configured to represent, in the timing undirected graph, the sequential device in the netlist by nodes;

timing undirected graph timing edge creating means configured to create timing edges between nodes in the timing undirected graph, wherein the timing edge between one node and another node in the timing undirected graph denotes that at least one of the following timing constraints exist between the sequential devices represented by the two nodes:

an asynchronous clock;

a false path; and a multi-cycle path and the number of timing check cycles between the two sequential devices exceeds a preset number of clock cycles; and wherein the asynchronous clock, the false path and the multicycle path are timing constraint relationships included in the timing constraint file.

12. The system of claim 8, wherein the combination means comprises:

sequential device undirected graph node creating means configured to denote the nodes of one of the connection undirected graph and the timing undirected graph as the nodes in the sequential device undirected graph; and sequential device undirected graph edge creating means configured to create edges between nodes in the sequential device undirected graph, wherein the edge between one node and another node in the sequential device undirected graph denotes that there is a connection edge between the nodes to which the two nodes correspond in the connection undirected graph, wherein there is no timing edge between the nodes to which the two nodes correspond in the timing undirected graph.

13. The system of claim 9, wherein the combination means comprises:

sequential device undirected graph node creating means configured to denote the nodes of one of the connection undirected graph and the timing undirected graph as the nodes in the sequential device undirected graph; and sequential device undirected graph edge creating means configured to create edges between nodes in the sequential device undirected graph, wherein the edge between one node and another node in the sequential device undirected graph denotes that there is a connection edge between the nodes to which the two nodes correspond in the connection undirected graph, while there is no timing edge between the nodes to which the two nodes correspond in the timing undirected graph.

14. The system of claim 10, wherein the combination means comprises:

sequential device undirected graph node creating means configured to denote the nodes of one of the connection undirected graph and the timing undirected graph as the nodes in the sequential device undirected graph; and sequential device undirected graph edge creating means configured to create edges between nodes in the sequential device undirected graph, wherein the edge between one node and another node in the sequential device undirected graph denotes that there is a connection edge between the nodes to which the two nodes correspond in the connection undirected graph, while there is no timing edge between the nodes to which the two nodes correspond in the timing undirected graph.

15. The system of claim 11, wherein the combination means comprises:

sequential device undirected graph node creating means configured to denote the nodes of one of the connection undirected graph and the timing undirected graph as the nodes in the sequential device undirected graph; and sequential device undirected graph edge creating means configured to create edges between nodes in the sequential device undirected graph, wherein the edge between one node and another node in the sequential device undirected graph denotes that there is a connection edge between the nodes to which the two nodes correspond in the connection undirected graph, while there is no timing edge between the nodes to which the two nodes correspond in the timing undirected graph.

16. The system of claim 12, wherein the grouping means is further configured to group the sequential devices represented by the nodes included in a connected sub-graph in the sequential device undirected graph into one group.

17. The system of claim 13, wherein the grouping means is further configured to group the sequential devices represented by the nodes included in a connected sub-graph in the sequential device undirected graph into one group.

18. The system of claim 14, wherein the grouping means is further configured to group the sequential devices represented by the nodes included in a connected sub-graph in the sequential device undirected graph into one group.

19. The system of claim 15, wherein the grouping means is further configured to group the sequential devices represented by the nodes included in a connected sub-graph in the sequential device undirected graph into one group.

20. The system of claim 8, wherein said timing constraint defines clock signal arrival times at said sequential devices.

* * * * *